United States Patent [19]

Rzeszewski et al.

[11] 4,214,274

[45] Jul. 22, 1980

[54] FREQUENCY SYNTHESIZER TUNING SYSTEM WITH VARIABLE DWELL SIGNAL SEEK

[75] Inventors: Theodore S. Rzeszewski, Lombard; Paul D. Frantzis, Chicago, both of Ill.

[73] Assignee: Matsushita Electric Corporation, Franklin Park, Ill.

[21] Appl. No.: 916,489

[22] Filed: Jun. 19, 1978

[51] Int. Cl.² .............................................. H04N 5/44
[52] U.S. Cl. .............................. 358/193.1; 358/194.1; 358/195.1
[58] Field of Search ............... 358/191, 192, 193, 194, 358/195

[56] References Cited

U.S. PATENT DOCUMENTS

| | | | |
|---|---|---|---|
| 3,421,105 | 1/1969 | Taylor | 331/4 |
| 3,849,731 | 11/1974 | Morita | 358/193 |
| 3,906,351 | 9/1975 | Evans | 358/191 |
| 3,916,319 | 10/1975 | Hawley | 325/470 |
| 4,041,535 | 8/1977 | Rzeszewski | 358/191 |
| 4,110,693 | 8/1978 | Evans | 358/193 |

OTHER PUBLICATIONS

ET/D, Sep. 1978; "RCA's Direct Address Tuning System," by Paul Shih, pp. 28–30, 32, 34, 35 & 61.

*Primary Examiner*—David L. Stewart
*Attorney, Agent, or Firm*—Lavalle D. Ptak

[57] ABSTRACT

A television tuning system employs a frequency synthesizer system for establishing the tuning of the receiver. A first programmable frequency divider controlled by a reversible counter is connected between the output of a reference oscillator and a phase comparator to which the output of the local oscillator, after passing through another programmable frequency divider, also is applied. The phase comparator output is a tuning voltage used to control the tuning of the local oscillator. A logic circuit responsive to characteristics of the received signals changes the count in the reversible binary counter to adjust the first programmable frequency divider to compensate for channel frequency offsets which may occur in excess of the pull-in range of the AFT discriminator circuit. To permit operation of the receiver as a signal seek receiver, a pair of signal seek push buttons for the "up" and for the "down" direction, respectively, are provided. Operation of either of these push buttons functions in conjunction with further logic circuitry and in conjunction with timing circuitry to automatically step tune the receiver channel-by-channel in the selected direction until a channel with a signal present is sensed by the first logic circuit, whereupon the signal seek circuit operation is disabled until one or the other of the signal seek push buttons is reactivated. The dwell time of the logic circuit for some steps is extended depending upon the relationship of the new channel to the previous channel. The dwell time also is extended for manual or direct access channel selection.

6 Claims, 3 Drawing Figures

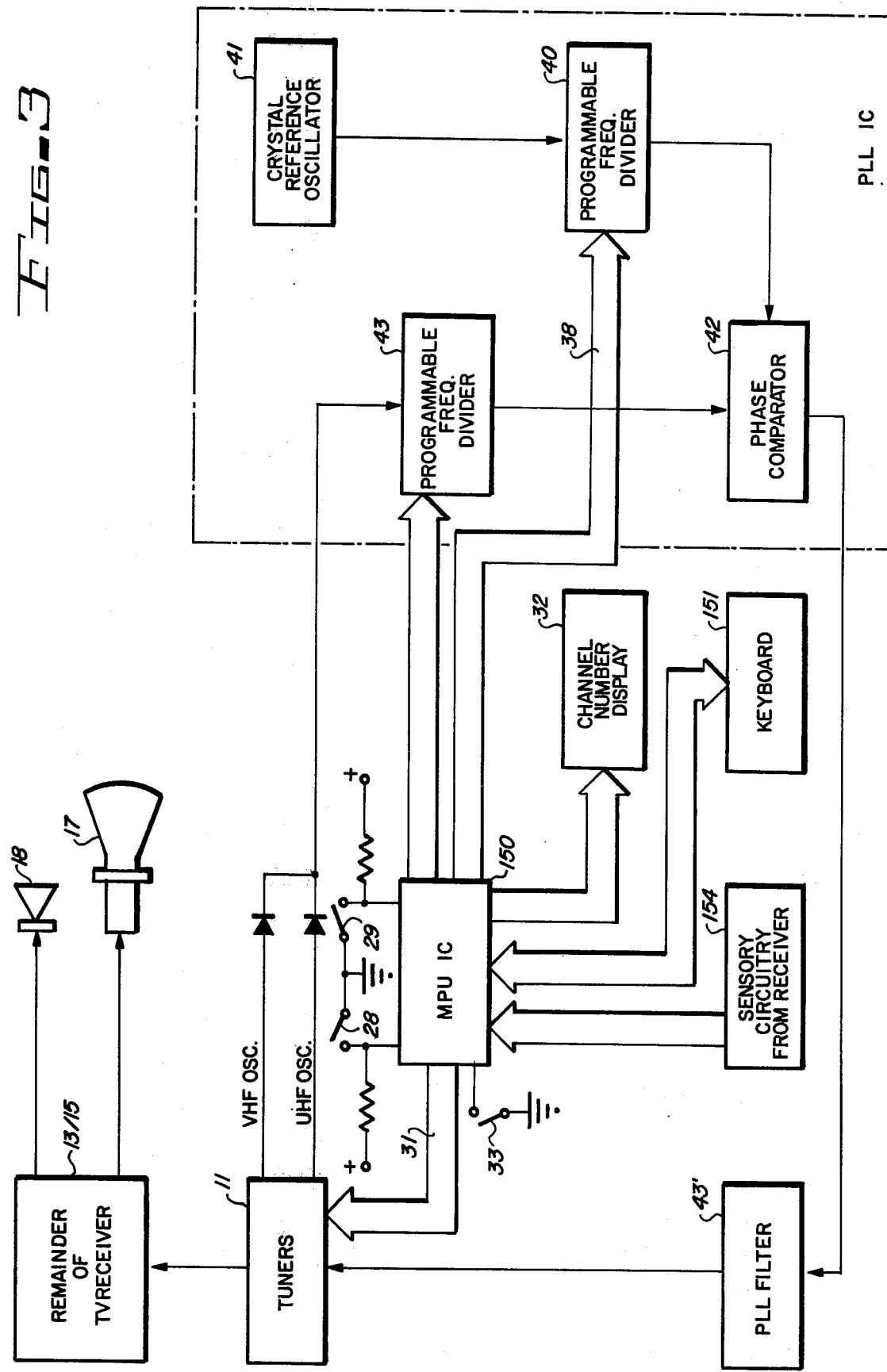

FREQUENCY SYNTHESIZER TUNING SYSTEM WITH VARIABLE DWELL SIGNAL SEEK

RELATED PATENT

This application is directed to an improvement in the tuning system disclosed in U.S. Pat. No. 4,041,535, issued Aug. 9, 1977.

BACKGROUND OF THE INVENTION

One adjustment which still generally must be made in most television receivers is a fine tuning adjustment. Frequency synthesizer tuning systems having a wide pull-in range and operating to automatically correct for frequency offsets without affecting the operation of the conventional frequency synthesizer in the tuning system have been developed. In addition, systems exist which permit manual fine tuning adjustments to override the frequency synthesizer tuning adjustments when such overriding manual tuning is desired.

These systems represent a substantial improvement over systems of the prior art which either used solely a manual fine tuning adjustment or which merely used a conventional frequency synthesizer system without a frequency offset correction provision. In the past, there has been some interest in providing a television receiver with a "signal seek" feature, that is, a tuning system which, upon command, seeks the next available transmission signal, skipping intermediate unused channels or channels which do not have a signal broadcast on them at the time the receiver is being operated. A signal seek tuning system which is compatible with a frequency synthesizer tuning system having an automatic offset correction feature is disclosed in the above-identified related patent.

In the frequency synthesizer tuning system with signal seek disclosed in U.S. Pat. No. 4,041,535, a compromise must be made between the signal seek search speed and accurate tuning acquisition. As the search speed is increased, tuning acquisition accuracy deteriorates, particularly for difficult channel transitions such as channel transitions from one band to another (low VHF band to high VHF band or UHF, high VHF band to low VHF band or UHF, and vice-versa).

The transitions for changes between channels in different tuning bands or between channels located at extreme ends of the same tuning band create ringing in the tuning voltage; so that it is possible to obtain a momentary channel verification and then lose it one or more times before the system settles down. If the decision for channel acquisition is made at the time verification has been momentarily lost, the signal seek system would advance to the next channel location even if there was a station present. In the past, this problem has been dealt with by simply slowing down the signal seek operation across the entire spectrum of channels to allow sufficient time for interrogating every channel (thus lengthening the dwell time at each step-by-step interrogation to the length required for the worst case). Since for most channel-to-channel stepping, however, the problem does not exist, a faster search speed (a shorter interrogation or dwell time per channel) permits reliable acquisition; and a faster search speed is desirable to permit the system to rapidly skip over channel locations where no signal is present.

It is desirable to incorporate into a frequency synthesizer tuning system having a signal seek function, a provision for selectively lengthening a normally short interrogation or dwell time whenever the channel-to-channel stepping from a previous channel to a new one is one which most likely requires a longer dwell time; but to do this only for such stepping intervals which are likely to have this problem.

SUMMARY OF THE INVENTION

Accordingly, it is an object of this invention to provide an improved tuning system for a television receiver.

It is an additional object of this invention to provide an improved frequency synthesizer tuning system for a television receiver.

It is another object of this invention to provide an improved signal seek feature for a frequency synthesizer tuning system for a television receiver.

It is a further object of this invention to provide a frequency synthesizer tuning system for a television receiver having a provision for adjusting the synthesizer loop for frequency offsets and in addition including a provision for a compatible stepped signal seek tuning function with an extension of the interrogation dwell time for selected channel-to-channel steps.

In accordance with a preferred embodiment of this invention, a frequency synthesizer tuning system for the tuner of a television receiver includes a voltage-controlled local oscillator in the tuner and a stable reference oscillator. A first programmable frequency divider is connected between the output of the reference oscillator and one input to a phase comparator. A second programmable frequency divider is connected between the output of the local oscillator and the other input to the phase comparator. The output of the phase comparator then comprises a control signal which is supplied to the local oscillator to control the frequency of its operation.

Selection of a desired channel by the viewer causes a predetermined division ratio to be established in the programmable frequency divider each time a channel is selected. Similarly, depression of either an "up" or "down" signal seek push button causes a predetermined division ratio for the next higher or lower channel, respectively, to be established in the programmable frequency divider. In addition, a control unit coupled with the AFT circuit operates to change the division ratio of the programmable frequency divider whenever predetermined signal conditions exist in the AFT discriminator circuit. This, then, permits the system to adjust for frequency offsets of the signal which otherwise would cause the station to be mistuned. If the control circuit, however, does not locate a receive signal within a pre-established period of time, and the system is in its signal seek mode of operation, the next higher or lower channel (in the direction selected by the operation of the signal seek push button) is stepped to automatically; and the offset correction circuit once again searches for a received signal. This cycle repeats until a received signal is sensed by the control circuit. The pre-established period of time is varied in accordance with the particular relationship of the next channel in the seek sequence to the previous channel.

BRIEF DESCRIPTION OF THE DRAWINGS

FIG. 3 is a block diagram of another preferred embodiment of the invention.

DETAILED DESCRIPTION OF THE PREFERRED EMBODIMENT

Figure 1:
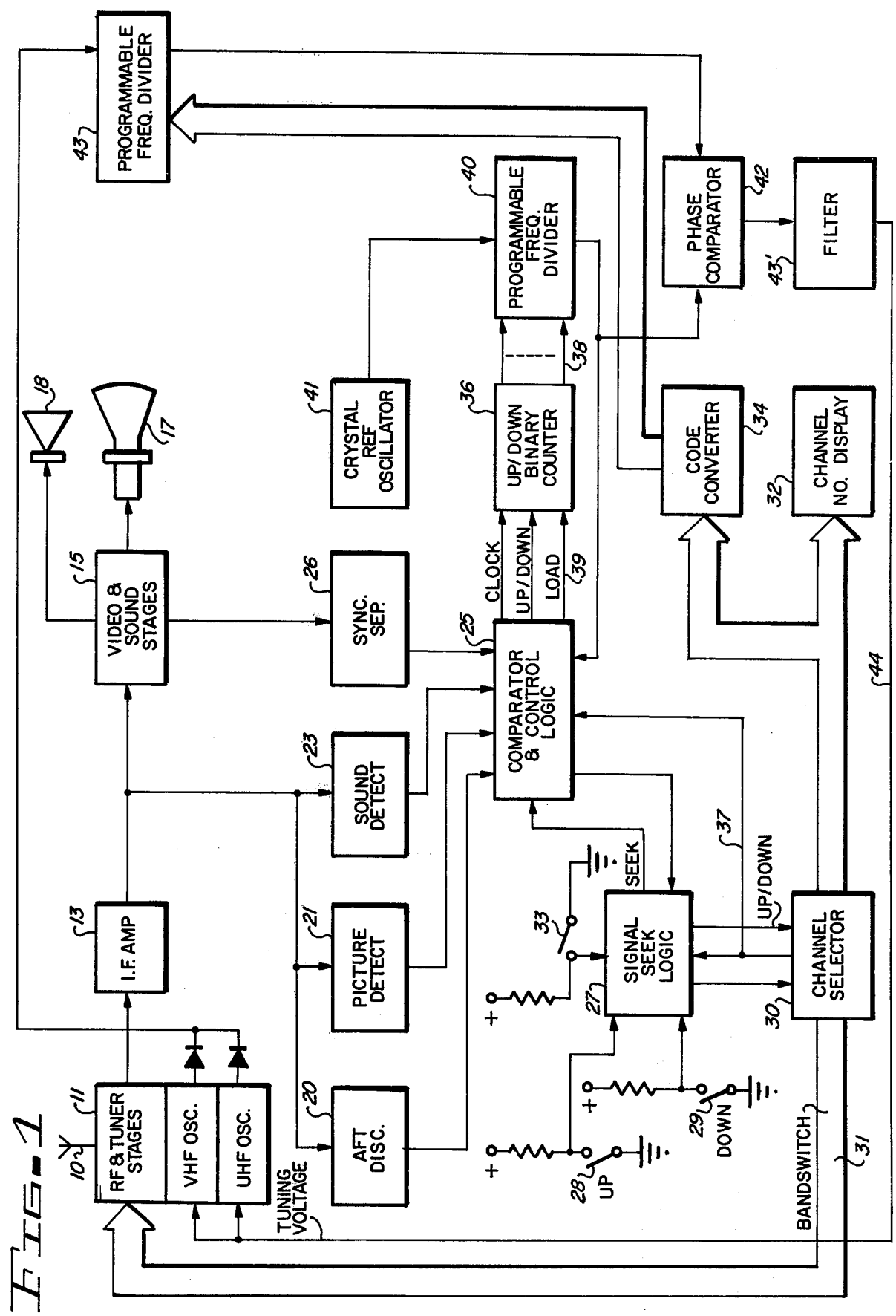
FIG. 1 is a block diagram of a television receiver employing a preferred embodiment of the invention.

Referring now to the drawings, the same reference numbers are used throughout the figures to designate the same or similar components. In addition, in FIG. 1, the reference numbers of components which also are disclosed in related U.S. Pat. No. 4,041,535 referred to above, are the same as used in that patent.

A major portion of the circuitry of the television receiver shown in FIG. 1 is conventional and, for that reason, it has not been shown in detail. Transmitted composite television signals either received over the air or distributed by means of a master antenna TV distribution system are received by an antenna 10 or on antenna input terminals to the receiver. As is well known, these composite signals include picture and sound carrier components and synchronizing signal components, with the composite signal being applied to an RF and tuner stage 11 of the receiver. The stage 11 includes the RF amplifiers and tuner sections of the receiver including a VHF oscillator section and a UHF oscillator section, specifically indicated as such in the stage 11 of FIG. 1. Preferably, the UHF and VHF local oscillators are voltage-controlled oscillators, the frequency of which is varied in response to a tuning voltage applied to them to effect the desired tuning of the receiver.

The output of the RF and tuner stages 11 is applied to an IF amplifier stage 13 which supplies the conventional picture (video) and sound IF signals to video and sound detectors and processing stages 15 of the receiver. The stages 15 may be of any conventional type used to separate, detect, amplify and otherwise process the signals for application to a cathode-ray tube 17 and a loudspeaker 18 which reproduce the picture and sound components, respectively, of the received signal.

The output of the IF amplifier 13 also is supplied to a conventional AFT or automatic fine tuning discriminator circuit 20 for developing an automatic fine tuning control voltage. In addition, the output of the IF amplifier stage 13 is supplied to a narrow-band picture carrier detection circuit 21 and a narrow-band sound carrier detection circuit 23 which produce output signals whenever a carrier is tuned to the narrow band of frequencies of these circuits is designed to detect. For a properly tuned television station, the picture carrier detection circuit 21 and the sound carrier detection circuit 23 both simultaneously produce output signals. If neither of these circuits produces an output signal for a selected channel, this is indicative that no transmitted signal is present for that channel. In addition, if only one of the circuits 21 or 23 produces an output signal, this is indicative of a grossly mistuned condition of the receiver. For directly tuned or step-tuned systems, detection of the picture carrier alone is sufficient since such gross mistuning is very unlikely.

The outputs of the discriminator 20 and detector 21 (or both detectors 21 and 23, if both are used) are supplied to a comparator and control logic circuit 25 which also may be provided with synchronizing signals, such as the vertical synchronizing signals obtained from a conventional synchronizing signal separator circuit 26 coupled with the video and sound stages 15 of the receiver.

When the viewer desires to select a new channel, he enters the desired channel number into a channel selector 30 which preferably includes a keyboard to effect the channel selection. There are a number of different keyboards and associated memory circuits which may be used to accomplish this function, and the particular design is not important to this invention. It should be noted that ideally the channel selector 30 and its associated circuitry includes a memory circuit which is preprogrammed to provide output signals corresponding to the entry of data from the keyboard portion of the channel selector 30. In addition, the channel selector 30 also may include switching circuitry for providing a band switch function over band switching control leads 31 to the RF and tuner stages 11. This band switching operation also is a straightforward approach to relate the appropriate band switching information to the tuner according to the channel which has been selected. The channel selector 30 then provides output signals which operate a channel number display 32 to provide an appropriate display of the selected channel number to the viewer.

The signals which are utilized to operate the channel number display 32 also are applied to a code converter circuit 34 which decodes the selected channel number into a parallel-encoded signal. This may be done in any conventional manner and may be in the form of BCD code or another suitable code. This encoded signal is applied to corresponding inputs of a programmable frequency divider 43 to cause the division number to relate the divided-down frequency of the tuner oscillators to the frequency of a reference oscillator 41 for properly tuning the receiver to the selected channel. Conventional frequency synthesizer techniques are employed except the code converter 34 is necessary because of non-uniform channel spacing of the television signals. It is most convenient to cause the programmable frequency divider 43 to divide by numbers corresponding to the oscillator frequency of the selected channel. For example, 101, 107, 113 . . . up to 931.

A timing or "load" pulse is applied over a lead 37 to the comparator and control logic 25 each time a new channel number is selected by the keyboard or by the circuitry of the channel selector 30. This pulse causes the comparator and control logic circuit 25 to supply a corresponding pulse on a lead 39 to load or enter a fixed binary number into a reversible binary counter 36. The manner in which this is done is explained more fully in conjunction with FIG. 2. This number is selected to be at or near the midpoint of the count capacity of the counter 36.

The outputs of each of the stages of the binary counter 36 then are applied over parallel output leads 38 to corresponding inputs of a second programmable frequency divider 40. A fixed-frequency, stable, reference oscillator 41 is coupled to the input of the frequency divider 40; so that the output signal of the divider 40 is a stable reference frequency used to maintain tuning of the receiver to the selected channel. This divided-down stable reference signal is supplied to one of two inputs to a phase comparator circuit 42. The other input of the phase comparator circuit 42 is supplied from the selected one of the VHF and UHF oscillators in the tuner stages 11 through the programmable divider circuit 43. The phase comparator 42 operates in a conventional manner to supply a direct current (DC) tuning control signal through a filter circuit 43' and over a lead 44 to the oscillators in the tuner stages 11 to change and maintain their operating frequency.

The operation of the system which has been described thus far is very similar to that of a relatively conventional frequency synthesizer system. If, however, there is a frequency offset in the received signal, causing the carrier of the received signal to be displaced from the frequency which it should have to some other frequency, it is possible that the system would give the appearance of mis-tuning the received station. To eliminate this disadvantage and still retain the advantages of fully automatic "hands-off" frequency synthesizer tuning, the comparator and control logic circuit 25 is employed in conjunction with the reversible binary counter 36 and the programmable frequency divider 40 to automatically maintain proper tuning.

The comparator and control logic circuit 25 responds to the output of the AFT discriminator circuit 20 to see if the output voltage of the discriminator is within a specified window. If that condition is present, the control logic circuit 25 determines that there is no frequency offset; and the system operates as a conventional frequency synthesizer tuning system so long as a picture carrier is detected by the picture detector 21. For some systems, simultaneous detection of the sound carrier by the sound detector 23 along with detection of the vertical synchronizing signals may be used instead of only the picture carrier detection.

If, however, the AFT voltage at the output of the AFT discriminator 20 is outside this window, or if the proper outputs are not present from the detector 21 (or the detectors 21 and 23 or the sync separator 26), the comparator and control logic circuit 25 operates to change the count in the binary counter 36. This change is in the proper direction established by the circuit 25 in response to its inputs to effect a corresponding change in the division ratio or division number of the programmable frequency divider 40. This, in turn, causes the reference oscillator frequency supplied to the phase comparator 42 to be automatically changed to correct for the frequency offset in the received carrier signal.

The system always maintains the crystal stability of the oscillator 41 in its operation to accurately maintain the tuning which has been established. An additional mode of operation, namely a "signal seek" mode of operation, often is desired in television receivers. This type of operation is one in which the viewer, often working in conjunction with a remote control input, desires to step the television receiver tuning to the next higher or next lower available channel which is being transmitted in the area in which the receiver is used. In a "signal seek" receiver, the receiver automatically skips over channel positions which are unused or on which no signals are being transmitted at the time the receiver is used.

Initially, it would appear that the feature for automatically correcting for tuning offset is incompatible with a "signal seek" capability of the receiver, because a "seek" in a frequency synthesizer system must progress from one channel location to the next (either up or down) looking for a channel where the sensors, in the form of the AFT discriminator 20, picture detector 21, sound detector 23 and sync separator 26 tell the system there is a station present. But it also is necessary not to pass by a station which may have a frequency offset in which these same sensors must have a composite response wide enough to sense offsets that may range as much as ±2 Megahertz. This, however, makes a conventional seek system more susceptible to locking to false signals and also runs contrary to what is ordinarily desired for correct tuning. These problems, however, have been overcome with the signal seek logic circuit 27 shown in FIG. 1. This logic circuit operates in conjunction with the channel selector 30 and a pair of push button control switches 28 and 29, to, at the option of the viewer, cause the system to operate in a signal seek mode of operation in either the "up" or "down" direction, as selected, respectively, by the switches 28 and 29.

Figure 2:
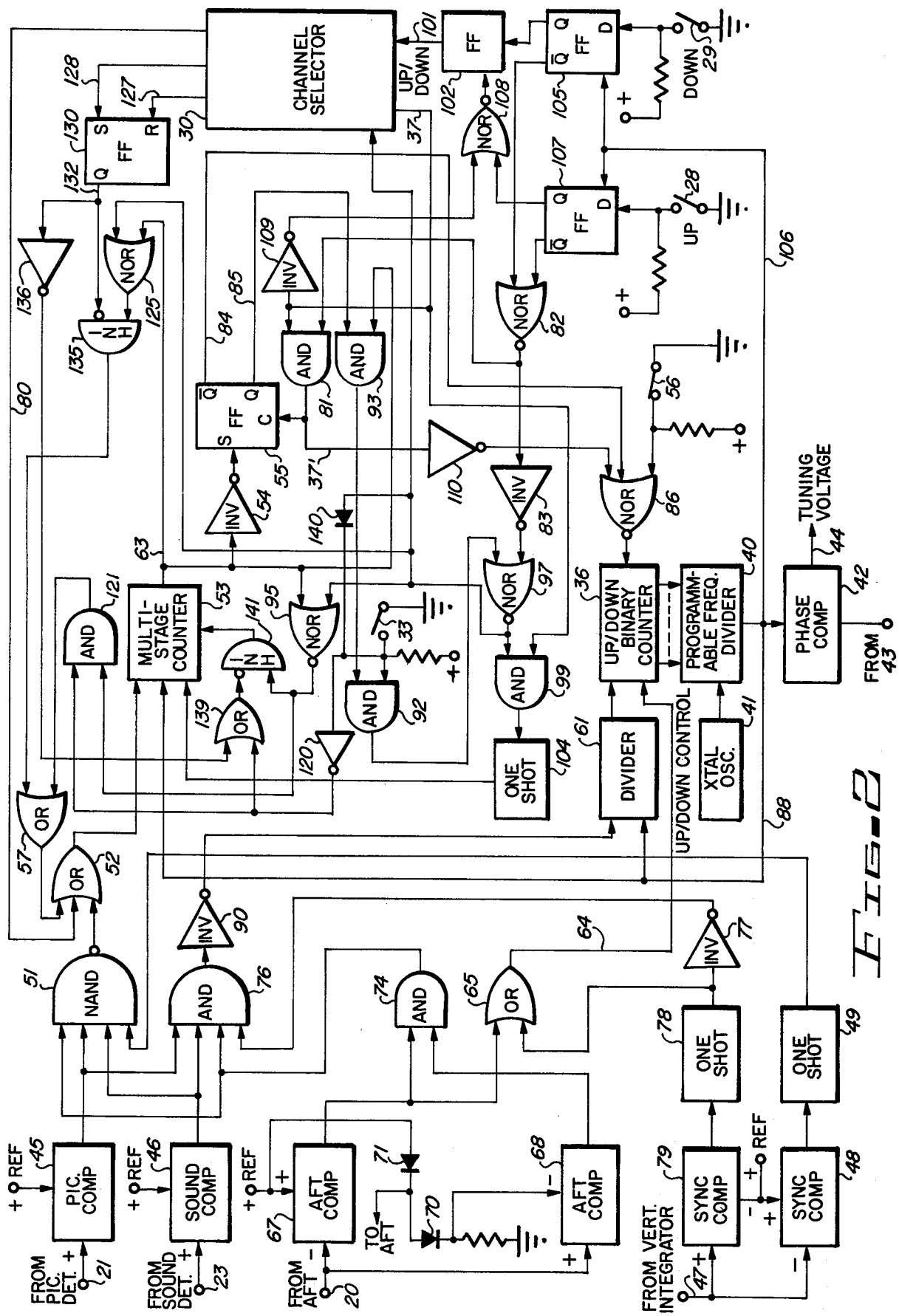
FIG. 2 is a more detailed block diagram of a portion of the circuit shown in FIG. 1.

The manner in which this operation takes place in conjunction with the comparator and control logic circuit 25 will become apparent in conjunction with the description of the operation of the circuit shown in FIG. 2.

The comparator and control logic circuit 25 and the signal seek logic circuit 27 are shown in greater detail in FIG. 2 to which reference now should be made. It should be noted that although two separate circuits 25 and 27 are shown in FIG. 1 to simplify the description of the operation of the system, the logic of these two circuits is closely interrelated and in some portions is shared, as will become apparent in conjunction with the description of the operation of the circuit shown in FIG. 2. In addition, the reversible binary counter 36, programmable frequency divider 40, crystal oscillator 41 and phase comparator 42 also are shown in FIG. 2 to indicate the interrelation of these components of the circuit with the logic circuits 25 and 27, which comprise the remainder of the circuitry shown in FIG. 2.

Ideally, the center count which is set into the counter 36 upon the selection of a new channel by the channel selector 30, either by entry in the keyboard or under the control of the signal seek logic circuit 27, should result in accurate tuning of the receiver to the desired channel, as determined by the division ratio set into the programmable frequency divider 43 (FIG. 1). The tuning accuracy of the system is a function of the stability of the crystal-controlled reference oscillator 41. As also described previously, however, if a frequency offset is present in the signal of the selected channel, the comparator control logic circuit 25 causes the count in the binary counter 36 to be increased or decreased by an amount sufficient to change the division ratio of the programmable frequency divider 40 to effect the desired change in the tuning voltage from the output of the phase comparator 42 necessary to properly tune the local oscillators in the RF and tuner stages 11 of the receiver.

Assume, initially, that the signal seek logic circuit 27 is disabled. This is accomplished by closing a normally-open switch 33 to apply ground potential to the signal seek logic circuit 27 (FIG. 1). This switch 33 also is shown in FIG. 2, and the manner in which closure of this switch functions to defeat the signal seek logic circuit operation 27 is explained subsequently. With the circuit 27 disabled by closure of the switch 33, the presence of a selected channel signal transmission is detected by the picture detector 21, (or by the picture carrier 21, the sound detector 23, and the sync separator circuit 26, FIG. 1). If a carrier is detected by the picture carrier detector circuit 21, the output of the picture carrier detector applied to a comparator circuit 45 causes the output of the comparator circuit 45 to go high (positive). Similarly, the detection of a sound carrier by the sound carrier detector circuit 23 causes the output of a sound comparator circuit 46 to go high. Additional information for determining whether or not the receiver is properly tuned to a selected channel is supplied from the AFT discriminator 20 (FIG. 1) to a pair of AFT comparator circuits 67 and 68 (FIG. 2).

An additional piece of information which may be used to determine whether the receiver is properly tuned to a received station is obtained from the synchronizing separator circuit 26 in the form of vertical sync pulses applied to a terminal 47. These pulses are compared in a sync comparator circuit 48 which produces negative or low clock pulses at the vertical rate on its output each time a vertical sync pulse is applied to the input terminal 47. Each of the pulses at the output of the comparator 48 triggers a one-shot multivibrator 49, connected as a missing pulse detector sometimes called a retriggerable one-shot multivibrator, to its unstable condition. The timing period of the one-shot multivibrator 49 is greater than the interval between vertical synchronizing pulses; so that for normal transmission, the one-shot multivibrator 49 remains in its unstable state since each trigger pulse applied to it restarts its timing interval. This produces a high output from the multivibrator 49 so long as vertical synchronizing pulses continue to be detected by the comparator circuit 48.

As a consequence, all of the inputs to a NAND gate 51 are high if signal transmission is detected by the presence of picture and sound carriers in proper relation to each other, by an AFT signal in the window established by the AFT comparators 67 and 68, along with vertical synchronizing pulses. The output of the NAND gate 51, when this condition occurs, then goes low which clears a multi-stage counter 53 through on OR gate 52 to an initial "zero" count condition and also prevents the counter 53 from counting so long as this "low" input is applied to it.

A second input to the OR gate 52 is obtained from the channel selector circuit 30 and is a normally low signal for the selection of a valid channel number by the channel selector 30. That is, the potential on the lead 80 applied to the second input of the OR gate 52 is low whenever a number for a valid television channel 2–83 is selected by the channel selector 30. If for some reason the channel selection by the channel selector 30 is an invalid channel number not corresponding to one of channels 2 to 83, the potential on the lead 80 goes high and overrides control of the multi-stage counter 53 by the NAND gate 51, permitting the counter 53 to count in response to the application of clock pulses applied to it.

A third input to the OR gate 52 is obtained from the output of an OR gate 57 and this output is normally low. The operation of the gate 57 is described subsequently.

Each time a new channel number is selected by the channel selector 30, either by the viewer entering a new channel number on a keyboard or in response to a pulse from the signal seek logic portion of the circuitry, a "clear" pulse is applied to a flip-flop 55 through an AND gate 81. This pulse also feeds a NOR gate 86 which applies the pulse to the counter 36. In this way the flip-flop 55 and counter 36 are reset each time a new channel is selected. This pulse constitutes one of the two inputs to the AND gate 81, the second input to which is obtained from a NOR gate 82. In the condition of operation under description, this second input from the NOR gate 82 is a normally high enabling input for the AND gate 81. The flip-flop 55 then produces a "high" output on its $\bar{Q}$ output lead 84 and produces a "low" output on its Q output lead 85.

The output lead 84 is one of the three inputs to a NOR gate 86 which produces a low output whenever any of the inputs to it are high. An offset correction defeat switch 56 is connected to one of the three inputs of this NOR gate and this switch is normally closed unless the offset correction feature of the system is not desired. So long as the switch 56 is closed, the lowermost input to the NOR gate 86 is provided with a low or ground potential, as shown in FIG. 2. The input from the AND gate 81 on the lead 37' is normally high; however, it passes through an inverter 110 and provides a normally low signal except for the reset condition described above. The "high" output on the lead 84 from the flip-flop 55 thus causes a "low" output from the NOR gate 86.

The output of the NOR gate 86 is connected to the reversible counter 36; and whenever this output goes low, the aforementioned predetermined count is set into the counter 36. In addition, so long as the output of the gate 86 remains low, the counter 36 is prevented from changing count. The flip-flop 55 is connected as a divide-by-two circuit. Therefore, the above-mentioned output condition on the lead 84 alternates between a high level and a low level. The high level forces the counter 36 to a fixed count while the phase-locked loop is pulling in, and the low level allows a "localized smart search" to take place. The length of time for this "localized smart search" varies as determined by the operation of the counter 53, as described more fully subsequently.

If the output of the NAND gate 51 indicates that there is a television signal at the particular channel selected, and vertical synchronizing pulses are correctly received, the output of the NAND gate 51 clears the multi-stage counter 53 and prevents it from counting any further in response to pulses applied to its clock input terminal from the output of the programmable frequency divider 40 over a lead 88. Under this condition of operation, the output of the flip-flop 55 on lead 84 remains high; so that system functions as a conventional frequency synthesizer system.

If, however, following the selection of a channel which loads the binary counter 36 and sets the flip-flop 55 to its high condition on lead 84, the NAND gate 51 does not produce a "low" clear pulse to the multi-stage counter 53, but instead produces a high or positive output, the counter 53 is enabled for operation and is advanced in its count by pulses applied to its clock input from the output of the programmable frequency divider 40 on a lead 88. A pre-established count then is reached to provide a clock pulse over an output lead 63 and through an inverter 54 to the flip-flop 55 to clock the flip-flop to its opposite output condition, with a low output on lead 84 and a high output on the lead 85. This causes the output of the NOR gate 86 to go to a logical "1" or high output condition, which in turn enables the reversible counter 36 to commence counting in response to clock pulses applied to it and in the direction specified on the lead 64. These clock pulses also are the same clock pulses appearing on the lead 88 at the output of the programmable frequency divider 40 and are supplied to a frequency divider 61.

The pulses are passed through the divider 61 only if the output of an AND gate 76 is low at the same time; so that a high output is obtained from an inverter 90 connected between the AND gate 76 and the divider 61. So long as the output of the inverter 90 is high, the clock pulses on the lead 88 operate the divider 61 to supply clock pulses to the binary counter 36. These clock pulses cause the counter 36 to change its count in accordance with the nature of an up/down control signal applied to it over a lead 64 from the output of an up/down control OR gate 65. If this condition had been caused by a channel that has been offset, a point will be reached when the output from the picture detector 21 (or the outputs from the detector 21, from sound detector 23, and the vertical integrator on the terminal 47) once again indicates that a proper received channel is present. This, then, produces an output pulse from the NAND gate 51 which clears and stop the operation of the multi-stage counter 53. Also, the output from the gate 76 goes high, and is inverted by the inverter 90 to thereafter inhibit further operation of the divider 61 preventing any additional output clock pulses from being applied to the counter 36.

Thus, the output on lead 84 of the flip-flop 55, when it is high, enables the system to operate with all of the advantages of a conventional frequency synthesizer. When the output signal on the lead 84, however, is low, it enables the synthesizer to correct for cases where the channel frequency is not of the proper value. Once correct tuning is attained, the disabling of the divider 61 prevents a further change in the count of the up/down binary counter 36 and the system once again operates in the manner of a conventional frequency synthesizer.

If, now, for some reason, the AFT voltage supplied to the inputs of the comparator circuits 67 and 68 should rise above the voltage between the diodes 70 and 71 to a potential greater than one diode drop, the output of the comparator 67 goes low, while the output of the comparator 68 remains high. This causes the output of the AND gate 74 to go low, which in turn causes the output of the AND gate 76 also to go low. As a result, the output of the inverter 90 goes high and enables the divider circuit 61 once again for operation. As a consequence, the clock pulses applied to the divider 61 on the lead 88 once again are passed through the divider 61, after being divided down, to change the count in the binary counter 36 in response to the application of such clock pulses. As described previously, the direction in which the count of the binary counter 36 changes is controlled by the output of the OR gate 65 which has inputs supplied to it from the comparator 67 and the output of the one-shot multivibrator 78.

For the condition under discussion, the incoming signal is tuned low, that is, toward the next lower adjacent channel. For this condition, the sync pulse output from the vertical integrator applied to the terminal 47 also is normal; so that the output of the one-shot multivibrator 78 remains low. Thus, both inputs to the OR gate 65 are low and the potential on its output also is low. This results in a low signal on the lead 64 applied to the binary counter 36, causing the count in the binary counter 36 to advance for the application of each clock pulse applied to it from the output of the divider 61. This, in turn, causes corresponding changes in the division ratio or division number of the programmable frequency divider 40, thereby resulting in a change in the tuning voltage from the phase comparator 44.

When proper tuning once again is achieved, the AFT signal will be back again within the window established by the diodes 70 and 71; and the outputs of both AFT comparators 67 and 68 go high. Thus, the outputs of the AND gates 74 and 76 also go high. This, once again, inhibits the passage of pulses by the divider circuit 61, thereby terminating the application of further clock pulses to the reversible counter 36. Once this occurs, tuning of the oscillators in the tuning stages 11 is maintained by the normal output of the phase comparator 42 via the lead 44.

If the incoming received signal is tuned high, the AFT voltage applied to the inputs of the comparators 67 and 68 drops below the potential at the junction of the diodes 70 and 71. This is tuning toward the next adjacent higher channel and results in a relatively negative output from the discriminator circuit 20 because the picture carrier is tuned toward the adjacent channel sound trap. Once the voltage of this signal decreases to more than one diode drop below the voltage at the junction of the diodes 70 and 71, the output of the AFT comparators 68 goes low, while the output of the comparator 67 remains high. As a consequence, the outputs of the AND gates 74 and 76 once again low; and clock pulses are passed through the divider circuit 61. The up/down control potential on the output of the OR gate 65, however, now is high since the OR gate 65 has a high input applied to it from the comparator 67. Thus, the counter 36 is caused to count in the opposite or reverse direction. This effects the desired reference oscillator frequency correction in the same manner described previously but in the opposite direction.

As is well known, there are two positions at which the AFT signal from the AFT discriminator 20 crosses the "zero" reference voltage; and a lock of the AFT circuit can occur at either of these two positions. One is the correct position for the picture carrier and the other results from a mistuning toward the adjacent channel sound trap. In this condition, however, the sound information gets into the sync separator circuit 26 and results in a phase inversion of the recovered sync signal obtained at the output of the separator. When this inverted signal is applied to the terminal 47, the normally high output of the comparator 79 now changes to supply negative going pulses to the one-shot multivibrator 78 in synchronism with the pulses applied to the terminal 47.

The one-shot multivibrator 78 now is repeatedly retriggered or reset by the negative pulses applied to its input; so that its output, which was a normally low output, goes high and remains high for the duration of this mistuning condition. This output is inverted by the inverter 77 to cause the output from the AND gate 76 to go low, which in turn is inverted by the inverter 90 to enable the divider circuit 61, so that clock pulses can be applied through it to the reversible counter 36. At the same time, the positive output from the OR gate 65 results in a positive or high signal on the lead 64 to cause the binary counter 36 to count in its reverse direction, effecting a tuning of the receiver downward toward the intended channel, since this condition is indicative of a receiver which is mistuned high. Once the required correction has been accomplished, the outputs of the synchronizing signal comparators 48 and 79 revert back to the original condition of operation, the counter 53 once again is reset, and the output of the inverter 90 goes low to inhibit further operation of the divider 61. No more clock pulses then are passed to the counter 36.

When the system is to be operated in a "signal seek" mode, the switch 33 is opened to apply a positive enabling potential to one of the two inputs to an AND gate 92 and to disable (via an inverter 120) and AND gate 121. The other input to the AND gate 92 is obtained from an AND gate 93, which has the output on the lead 63 from the counter 53 applied to one of its inputs and the output from the flip-flop 55 appearing on the lead 85 applied to its other input.

When the circuit is in its "seek" mode of operation, it can operate in either the "up" or "down" direction. For the present, assume that it is operating in the "up" direction. The manner in which the direction is selected is described subsequently.

The flip-flop 55 operates as a divide-by-two circuit. It is clocked from the counter 53 through the inverter 54. Each time that the multi-stage counter 53 reaches the maximum count, it produces a "carry-out" pulse on the lead 63. This pulse does two things. First, it loads the counter 53 with a programmed number. This determines the time it takes for the counter to count to the maximum count again. Secondly, it provides a clock for the divide-by-two flip-flop 55. Therefore, the outputs Q and $\bar{Q}$ of the flip-flop 55 are changing at half the frequency of the clock from the counter 53, and they are of opposite polarity. However, each time a new channel is selected, the flip-flop 55 is cleared by a low output from the AND gate 81. This caused the Q output to be low and the $\bar{Q}$ output to be high until the next clock pulse when these outputs reverse polarity. With output Q low, the lead 85 is low and the AND gate 93 does not pass the next carry-out pulse from the counter 53 on the lead 63 to the gate 92. Therefore, no channel change takes place. This is the time interval that the phase-lock loop of FIG. 1, consisting of the local oscillator 11, divider 43, phase comparator 42, filter 43', divider 40, and reference oscillator 41 is permitted to pull-in and establish the nominal tuning for the channel.

The next carry-out pulse now causes the Q output of the flip-flop 55 to be high and $\bar{Q}$ to be low. This enables the gate 93, so that the next successive carry-out pulse on the lead 63 produces a channel change. Also, the lead 84 was high previously and is now low; therefore, previously the NOR gate 86 was forced low, loading the counter 36 and inhibiting it from counting. However, $\bar{Q}$ now is low, and the counter 36 can count, producing the "localized smart search" in response to the up/down control on lead 64 and clock pulses from the divider 61. If no channel is found before the next carry-out pulse on the lead 63, the carry-out pulse is passed through gates 93, 92, and 97 to the channel selector 30 to change to the next channel, up or down, depending on the level of lead 101. The manner in which this is accomplished may be by any suitable means and the result is the same as if the viewer had keyboarded into the channel selector 30 the next channel number, either higher or lower, as determined by the control lead 101. The direction may be controlled by a simple gating circuit taking any of a number of conventional logic configurations. The result, however, is a changing in the division ratio of the frequency divider 43 (FIG. 1) which, in turn, re-establishes the channel tuning to a different channel.

At the same time, a "load" pulse appears on the lead 37 in the same manner as occurs when a new channel is manually selected by keyboarding a new channel number into the channel selector 30. This pulse on the lead 37 is passed by the AND gate 99 to trigger a one-shot multivibrator 104, which enables the multi-stage counter 53 for operation. The time-out interval of the multivibrator 104 is longer than the time interval required to cause the multi-stage counter 53 to count from its load condition to the point where the carry-out pulse appears on the lead 63. It should be noted that the one-shot multivibrator 104 also is activated to provide this time interval for manually selected channel changes in the channel selector 30 since, when the system is operating in its non-seek mode, the AND gate 99 is permanently enabled by a positive potential applied to its upper input from the output of the NOR gate 97.

At the same time, the pulse on the lead 37 is passed by the AND gate 81 to clear the flip-flop 55 to the condition where the output on the lead 84 is high and the output on the lead 85 is low, as described previously. If the offset correction circuitry detects a channel at this new position, the system operates as described previously to stop the counting operation of the multi-stage counter 53 and the up/down binary counter 36. The system then operates in the manner of a conventional frequency synthesizer tuning system in the manner which previously has been described.

If, however, a channel is not found in response to this "change channel" signal appearing at the output of the NOR gate 97, the multi-stage counter 53 is permitted to advance in response to the pulses appearing on the lead 88 and results in clocking the flip-flop 55. As described previously, this enables the up/down binary counter 36, and it commences counting in the direction established by the signal on the lead 64 in the same manner described previously for the offset frequency correction operation. This can be termed a localized "smart search" mode of operation when the system is in its "seek" mode of operation.

If a channel is found in response to this localized search, prior to the time that the multi-stage counter 53 provides the next output pulse on the lead 63, the operation of the counter 53 is stopped in response to the output of the NAND gate 51 and the operation of the counter 36 is stopped in response to the output of the AND gate 76.

As stated previously, the switches 28 and 29 are preferably in the form of push button switches which are only momentarily closed to initiate the seek in whichever direction is selected by the chosen switch. For example, if the "down" switch 29 is momentarily closed, a flip-flop 105 provides a "low" logic "0" pulse to the flip-flop 102 preset, which then produces one of its two stable state outputs to the channel selector 30 indicative of a downward "seek" selection. This is used in the channel selector 30 to cause the channel selector to step to the next channel down from the one previously selected; and, so long as the flip-flop 102 remains set to this condition, each time a pulse is obtained from the output of the NOR gate 97 and applied to the channel selector 30, the channel selector steps to the next channel in the "down" direction. The main purpose of flip-flops 105 and 107 is to effect "debouncing". They are connected as standard clocked D (delay) flip-flops, and any contact bounce produced by either of the switches 28 or 29 is eliminated because these flip-flops are immune to input changes at any time other than the positive-going clock transitions. The clock is provided on the lead 106 from the divider 40.

Closing the switch 29 causes the seek to be in a downward direction. The "low" generated by closing switch 29 is applied to the data input of the clocked flip-flop 105. The outputs of the flip-flop 105 are indicative of switch 29 closure when Q is low and $\bar{Q}$ is high, but are delayed from the switch closure by the clock entry time. The high $\bar{Q}$ output of flip-flop 105 is applied to the input of the NOR gate 82. This forces the output of the NOR gate 82 to go low. This, in turn, disables the AND gate 81, and forces the output of the NOR gate 97 to go low, since it has a high input applied to it from the output of the inverter 83.

On the next clock pulse on the lead 106, immediately following release of the "down" push button 29, the "high" on the D input to the flip-flop 105 returns the flip-flop 105 to its original condition of operation, with a high output applied to the preset of the flip-flop 102 and a low output applied to the NOR gate 82. This has no effect on the flip-flop 102, but it does cause both inputs to the NOR gate 82 once again to be low, so that its output goes high. This enables the AND gate 81 and the NOR gate 97 for the signal seek operation previously described. When the output of the inverter 83 goes low, a high trigger pulse is applied from the output of the NOR gate 97 to step the channel selector 30 to the next channel, in the present example, in the "down" direction. The operation described previously in the signal seek mode then continues until a channel is detected in the manner described above.

Similarly, if it now is desired to cause the seek to be in the opposite direction, a momentary closure of the switch 28 may be made by the viewer. This clocks the "high" indicative of switch 28 closure to the $\bar{Q}$ output of the flip-flop 107. This high is applied to the lower input of the NOR gate 108 and a corresponding low output from $\bar{Q}$ output of the flip-flop 107 causes the NOR gate 82 to go high. As soon as the Q output of flip-flop 107 is clocked high by the next clock pulse on the lead 106 after switch 28 is closed, the NOR gate 108 goes low. Since this output is connected to the clear input of the flip-flop 102, the flip-flop 102 is triggered to its opposite state of operation, causing the direction of operation of the channel selector 30 in response to pulses obtained from the output of the NOR gate 97 to be in the "up" direction. The sequence of operation for stepping the channel selector 30 to the next channel (now in the "up" direction) and for setting the flip-flop 55 via the AND gate 81 is the same as described previously.

Under most conditions of operation, when the system is operating in its "signal seek" mode described above, it is desirable for the system to rapidly skip over all channel positions to which it is stepped by the operation of the channel selector 30 when no transmitted signal is present at such channel positions. This is accomplished by minimizing the length of time it takes for the counter 53 to count to its maximum count after the first "carry-out" pulse produced on the lead 63 in each cycle of operation of the counter 53, as the system is stepped channel-by-channel in its seek mode of operation. For some channel-to-channel transitions, however, namely those involved in stepping from a channel in one band to a channel in another band, a longer "smart search" time period is necessary to insure that the channel is not skipped over inadvertently, because of the longer time interval required for the system to settle down or reach a steady state mode of operation.

To accomplish both of these purposes, the programmed number which is loaded into the counter 53 in response to the output of the first "carry-out" pulse appearing on the lead 63 after the system is stepped to a new channel selection is either a number which is intermediate the initial "zero" reset and the "carry-out" count of the counter, or the counter is reset back to its "zero" count. Which one of these programmed numbers is entered into the counter 53 is determined by outputs from the channel selector 30 produced in accordance with a determination of whether the channel-to-channel step which is being effected by the channel selector 30 is one which goes from one tuning band to another or is within the same tuning band. This can be accomplished by gating circuits in a number of different configurations or by gating together a pulse representative of a channel selection and a pulse represented by any change in the band switching signals supplied to the tuner stages over the band switching leads 31 (FIG. 1). The coincidence gating arrangements which are used to produce this identification are not significant and for that reason have not been shown in detail in FIG. 2. All that is necessary is for a response to be received from the channel selector 30 indicative of these different conditions. This is accomplished by outputs provided over a pair of leads 127 and 128 applied to the reset and set inputs, respectively, of a control flip-flop 130.

Any time the channel-to-channel step of the channels selected by the channel selector circuit 30 is within the same tuning band, a pulse is applied over the lead 127 to the reset input of the flip-flop 130. This causes its $\bar{Q}$ output appearing on a lead 132 to be "high" or positive. The lead 132 is connected directly to the inhibit input of an inhibit gate 135 to cause the inhibit gate 135 to block passage of any pulses applied to its signal input. The signals appearing on the lead 132 also are inverted by an inverter 136 which is connected to one of two inputs of an OR gate 139, the other input to which is obtained from the output of the inverter 120. The output of the OR gate 139 is connected to the inhibit input of a second inhibit gate 140. Both inputs to the OR gate 139 are low when the system is in its seek mode and a "high" signal appears on the lead 132. Thus, the second inhibit gate 140 is enabled to pass pulses applied to its signal input.

When the flip-flop 130 is in this state of operation, the first carry-out pulse from the multi-stage counter 53 which appears on the lead 63, is applied to both NOR gates 95 and 125, which are enabled at this time from the output of the NOR gate 97, and passes through the NOR gate 95 and the enabled inhibit gate 140 to set the counter 53 with a programmed number intermediate its final or "carry-out" number and the "zero" count which is set into the counter by the output of the OR gate 52. As a consequence, the time required for the counter 53 to once again produce the next carry-out pulse on the lead 63 is considerably shorter than the time which elapses between the production of the first carry-out pulse on the lead 63 following the resetting of the counter by an output on the OR gate 52.

If a channel is detected by the logic circuit prior to its counting through to its final count again, the operation of the counter 53 and the counter 36 is terminated as described above. If, however, no channel is present, the multi-stage counter 53 once again counts through until the next carry-out pulse is produced on the lead 63. This causes the stepping of the channel selector circuit 30 to the next channel in the manner described previously, and the foregoing operation is repeated. So long as the channel-to-channel stepping produced by the channel selector 30 is within the same band, the programmable number which is reset into the multi-stage counter through the gate 140 in each of the cycles of operation, is one which produces a minimum dwell time or "localized smart search" for most rapid signal seek operation.

Assume now, however, that a channel-to-channel step is reached which goes from one band to another (either one VHF band to another VHF band or a VHF band to UHF band or vice-versa). In this event, a trigger pulse is applied over the lead 128 to the set input of the flip-flop 130, causing its $\bar{Q}$ output to go low. When this occurs the inverter 136 applies a positive signal through the OR gate 139 to the inhibit input of the inhibit gate 140, thereby preventing the inhibit gate 140 from passing any pulses from the output of the NOR gate 95. At the same time, however, the low signal appearing on the lead 132 now enables the inhibit gate 135; so that after the NOR gates 95 and 125 are enabled for the next cycle of operation, the next subsequent "carry-out" pulse from the counter 53 passes through the NOR gate 125 and the inhibit gate 135, and in turn through the OR gates 57 and 52 to the "zero" reset input of the counter 53, to cause the counter 53 to be reset to its longest or maximum count. As a consequence, the dwell time provided for the circuit to accomplish its "localized smart search" under these conditions is extended to a longer time. The added time for accomplishing this localized search is necessary to permit the system to "settle down" and allow a positive identification of the presence or absence of a signal at the selected channel. In all other respects the system operation is the same as described previously.

If the next channel-to-channel selection is once again within the same band, an output pulse then is applied over the lead 127 to the reset input of the flip-flop 130, causing its output on the lead 132 once again to go high. Under these conditions, pulses are passed through the NOR gate 95 and inhibit gate 140 to the counter 53 to set a higher program count into the counter causing its output pulse to appear in a shorter length of time once again. At the same time, the output pulses passed by the NOR gate 125 are blocked by the inhibit gate 135, so that they have no effect on the operation of the system.

Whenever the system is not being operated in its signal seek mode of operation, but instead is being operated in a manual mode or a direct channel selection by way of the keyboard in the channel selector 30, the switch 33 is closed as described previously. This in turn disables the AND gate 92 and causes a positive output to be obtained from the inverter 120 to enable the AND gate 121 and, by way of the OR gate 139, to apply a positive inhibiting input to the inhibit gate 140. Thus, the gate 140 is blocked from passing any pulses to the counter 53; but the AND gate 121 is enabled to pass pulses from the NOR gate 95 to the OR gate 57. The gates 95 and 125 are enabled by the ground potential applied to them from the switch 33 through an isolating diode 140.

As a result, irrespective of the output of the flip-flop 55, the OR gate 57 applies the trigger pulses produced by either of the NOR gates 95 or 125 through the OR gate 52 to reset the multi-stage counter 53 to its "zero" or minimum count (to produce a maximum search or dwell time) whenever the system is operating in its direct channel select mode. The reason for this is that when direct channel selection is desired, there is no necessity to quickly slip over the channel if no signal presence is detected, as is the case when the system is operating in a signal seek mode. Whenever the switch 33 once again is opened to place the system in its seek mode of operation, the flip-flop 130 once again is permitted to resume control of the programmed number which is inserted into the counter 53 as determined by the outputs from the channel selector circuit 30.

Reference should now be made to FIG. 3 which illustrates another embodiment of the invention which may be employed in place of the embodiment shown in FIGS. 1 and 2. The circuit of FIG. 3 operates in the same manner described above in conjunction with the circuits of FIGS. 1 and 2. Those circuit components which are the same in the circuit of FIG. 3 as in the embodiment described above are given the same reference numbers.

In place of the hard-wired dedicated logic which is used in the system of FIGS. 1 and 2, a microprocessor 150 is used in the system of FIG. 3 to respond to channel selections which are directly entered into the system by means of a keyboard 151 and to react to the sensing circuits in the form of the signals applied to the inputs of the comparator and control logic circuit 25 shown in FIG. 1. These circuits have been lumped together in a block designated "sensory circuitry from receiver" 154 in FIG. 3, and it should be understood that the sensing circuitry of the block 154 comprises essentially the sensing circuits 20, 21, 23 and 26 illustrated in FIG. 1, or in some cases may merely constitute a picture detector 21 and an AFT discriminator 20 if desired.

The microprocessor 150 is programmed to operate in response to the operation of the keyboard, the outputs of the sensory circuitry 154 and the output of the signal seek control switch 33 to control the division ratios of the programmable frequency dividers 40 and 43 in a manner which is functionally the same as that described above in conjunction with the embodiment shown in FIGS. 1 and 2. Greater flexibility of the control of the timing durations and the variable dwell in the signal seek operation, however, is afforded by use of a microprocessor 150 because of the fact that the variations can be changed by simple program changes without necessitating any change in the hardware. A typical microprocessor which may be used for the microprocessor 150 is the Matsushita Electronics Corporation MN 1401 microcomputer. A system using this microprocessor in place of the logic circuitry of FIG. 2, but programmed to perform the same functional results, has been built and operated successfully.

Once a station has been found by the signal seek circuit operation in either direction, the system locks onto that station and operates in the manner of a conventional frequency synthesizer. The receiver remains in such a state of operation until a new channel is selected by the channel selector 30 or until either the "up" signal seek switch 28 is momentarily closed or the "down" signal seek switch 29 is momentarily closed to initiate a new seek search function.

Whenever the viewer desires to disable the seek function, the switch 33 may be closed to apply a disabling ground potential to the AND gate 92. This prevents "change channel" pulses from passing through the AND gate 92 and the NOR gate 97 to the channel selector 30. Even with the switch 33 closed, however, it is possible to use the push button switches 28 and 29 to step the channel selector one channel in the selected direction in response to each momentary closure of these switches. This result is obtained because of the change in signal level at the output of the inverter 83 in response to this operation, which does result in a "change channel" output pulse from the NOR gate 97 each time this operation is effected. Only a single channel is stepped under these conditions, however, and there is no channel-by-channel "seek" function to the next highest available. If the channel to which the channel selector 30 is stepped does not have a signal on it, no additional stepping of the channel selector 30 takes place automatically through the operation of the multi-stage counter 53 and flip-flop 55 since the AND gate 92 is disabled. Of course, if the switch 33 is opened, the signal seek operation resumes.

While the foregoing description of a signal seek operation which is compatible with a frequency synthesizer tuning system having an automatic offset correction has been directed to specific circuit configurations, it should be noted that the circuits which have been selected for the purpose of illustrating the invention may be varied within the scope of the invention by those skilled in the art.

We claim:

1. A frequency synthesizer signal seek electronic tuning system for a tuner of a television receiver capable of receiving a composite television signal, said system including in combination:

control means for electronically step tuning the tuner of said television receiver channel-by-channel to a nominal tuning condition for each channel automatically in a signal seek mode of operation;

adjusting means coupled with said control means for automatically adjusting the tuning of said receiver to compensate for mistuning when said nominal tuning condition does not properly tune said receiver; and timing means coupled with at least said control means and responsive to a change in channel selection by said control means to be set to a first predetermined timing period for channel-to-channel changes of a first type effected by said control means and to be set to a second predetermined timing period longer than said first predetermined timing period for channel-to-channel changes of a second type effected by said control means, the output of said timing means being coupled with said control means for causing said control means to step tune the tuner of the television receiver to the next channel in response to an output pulse produced by said timing means at the end of said predetermined timing periods.

2. The combination according to claim 1 wherein said first predetermined timing period of said timing means is effected by an output from said control means for step tuning of the tuning of said receiver from one channel to another within a tuning band and said second predetermined timing period is effected by an output from said control means to said timing means when the tuning of said television receiver is stepped from one channel in one band to a channel in another band.

3. The combination according to claim 1 further including carrier signal sensing means coupled to receive at least the carrier signal components of the composite signal from the tuner and coupled to said adjusting means, said sensing means providing an output signal indicative of the tuning of said receiver to a carrier component of said composite signal for terminating operation of said adjusting means in response to such signal.

4. The combination according to claim 3 wherein said timing means causes said control means to electronically step tune the tuner of said television receiver to the next channel at the end of the operative first of second timing period for operation of said adjusting means if no carrier signal is detected by said carrier signal sensing means prior to the end of such timing period.

5. The combination according to claim 4 wherein said carrier sensing means is further coupled with said timing means and the output signal of said sensing means also terminates the operation of said timing means in response to the detection of a carrier signal in the composite signal from the tuner.

6. The combination according to claim 5 wherein said timing means includes counter means having inputs coupled with said control means and responsive to channel selection of a new channel by said control means to set said counter means to a first predetermined count corresponding to said first predetermined timing period for channel-to-channel changes of said first type and to set said counter means to a second predetermined count, corresponding to said second predetermined timing period for channel-to-channel changes of the second type, said second predetermined count being longer than said first predetermined count, the output of said counter means being coupled with said control means for effecting said electronic step tuning thereof; and clock means coupled with said counter means for operating said counter means to count at a predetermined rate from said first and second predetermined counts to a final count thereof to produce an output pulse on the output of said countermeans.

* * * * *